(12) United States Patent
Shibutani et al.

(10) Patent No.: US 6,252,377 B1
(45) Date of Patent: Jun. 26, 2001

(54) APPARATUS FOR DETECTING REMAINING CHARGE OF BATTERY

(75) Inventors: Atsushi Shibutani; Morio Kayano; Hiroshi Murakami, all of Wako (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/492,313

(22) Filed: Jan. 27, 2000

(30) Foreign Application Priority Data

Jan. 26, 1999 (JP) .................................................. 11-017680

(51) Int. Cl.$^7$ ........................................................ H02J 7/00
(52) U.S. Cl. .............................................................. 320/132
(58) Field of Search .............................................. 320/132

(56) References Cited

U.S. PATENT DOCUMENTS

| | | | |
|---|---|---|---|
| 5,889,385 | * | 3/1999 | Podrazhansky et al. ............ 320/132 |
| 5,917,305 | * | 6/1999 | Faulk ................................... 320/132 |
| 5,955,869 | * | 9/1999 | Rathmann ............................ 320/132 |
| 5,998,972 | * | 12/1999 | Gong ..................................... 320/132 |
| 6,037,749 | * | 3/2000 | Parsonage ............................ 320/132 |
| 6,075,339 | * | 6/2000 | Reipur et al. ........................ 320/132 |
| 6,107,802 | * | 8/2000 | Matthews et al. ................... 320/132 |

FOREIGN PATENT DOCUMENTS

WO 97/01103 * 1/1997 (NZ) ..................................... 320/132

* cited by examiner

*Primary Examiner*—Peter S. Wong
*Assistant Examiner*—Pia Tibbits
(74) *Attorney, Agent, or Firm*—Arent Fox Kintner Plotkin & Kahn, PLLC (57) ABSTRACT

The apparatus for detecting remaining charge of a battery, according to the present invention, comprises: current detector for detecting output electric current from and regenerative electric current to the battery; voltage detector for detecting a voltage output from the battery; low-pass filter for filtering the results of detection by the current detector and the voltage detector; time constant changer for changing the time constant of the low-pass filter; integrator for calculating the remaining charge in the battery by integrating the result of detection by the current detector; threshold voltage calculator for calculating a threshold voltage value corresponding to a specified value of the remaining charge, based on the electric current value filtered by the filter; comparator for comparing the threshold voltage value, calculated by the threshold voltage calculator, with the voltage value filtered by the filter; and resetter for resetting the remaining charge to the specified value when the filtered voltage value exceeds the threshold voltage value.

16 Claims, 9 Drawing Sheets

APPARATUS FOR DETECTING REMAINING CHARGE OF BATTERY

BACKGROUND OF THE INVENTION

1. Field of the Invention

The present invention relates to an apparatus for detecting the remaining charge in a battery, and in particular, to such a device for a vehicle.

This application is based on Japanese Patent Application No. Hei 11-17680, the contents of which are incorporated herein by reference.

2. Description of the Related Art

In recent years, electric vehicles and hybrid vehicles have been developed in order to reduce the discharge of carbon dioxide, in consideration of the global warming effect. These vehicles have a motor which does not discharge any gas, and a battery for supplying electric energy.

The electric vehicle is continuously driven by the motor. The hybrid vehicle utilizes the motor to assist the engine, and is often driven only by the motor.

Accurately detecting the remaining charge in the battery that supplies energy to the vehicle is important for determining whether to start charging or not, and to detect the remaining available time and the life of the battery.

A conventional method detects the remaining charge in the battery by time-integrating a charging current to the battery and a discharging current from the battery to the motor. The remaining charge basically corresponds to the total of charge stored in the battery. The total of the supplied and released electrical charge can be calculated by the time-integration of the electric current value (the charging current is positive, and the discharging current is negative). The details of this method can be understood from Japanese Patent Application, First Publication No. Hei 63-208773.

It is well known that, during the end stage of the charging (when the remaining charge is sufficient) or during the end stage of the discharging (when the remaining charge is insufficient), the rate of change in the output voltage from the battery with respect to the remaining charge varies largely. The reason for this is that the inner resistance of the battery varies depending on the remaining charge.

One of the background techniques, which takes into account these characteristics, corrects the remaining charge according to the voltage output from the battery when the ratio of change in the output voltage with respect to the remaining charge varies significantly (at the end of the charging or discharging).

During the intermediate period between the end stage of the charging and the end stage of the discharging, the electric current output from the battery is time-integrated so that the remaining charge can be obtained. As the rate of change in the output voltage increases, inflection points appear when entering the end stage of the charging or discharging. Then, based on the output voltage, the remaining charge obtained by the time-integration of the electric current is corrected, to thereby obtain the accurate remaining charge. This technique is described in Japanese Patent Application, First Publication Nos. Hei 6-342044, and Hei 5-87896.

Figure 9:
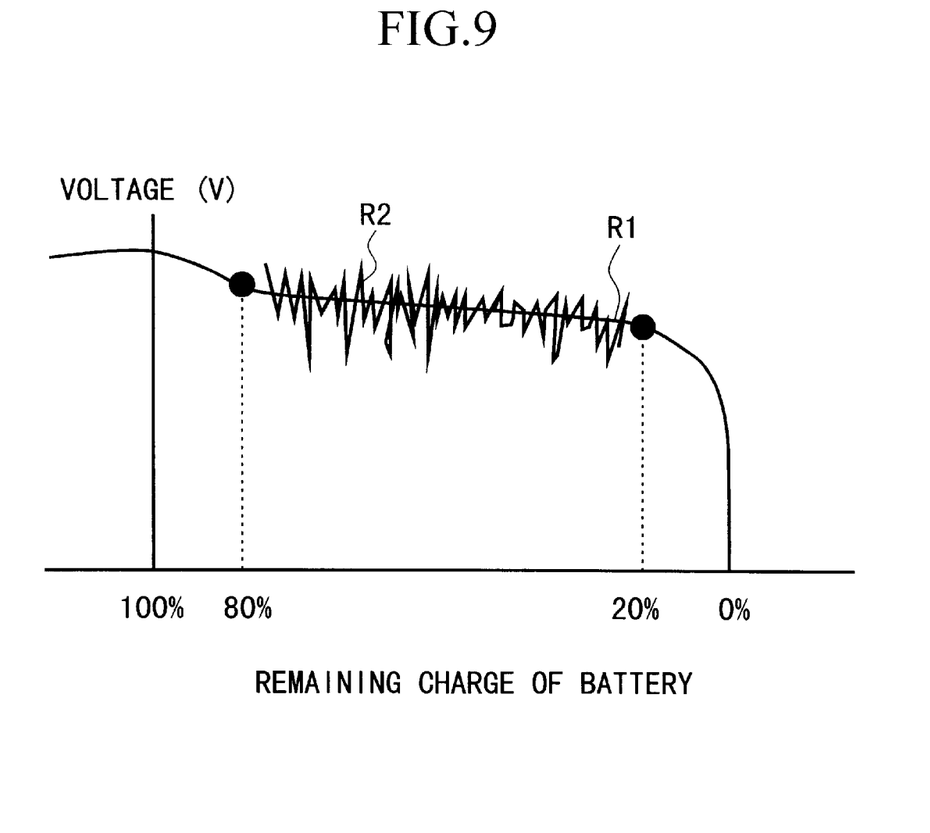
FIG. 9 is a diagram showing an example of the change in the voltage output from the battery.

FIG. 9 is a diagram showing the change in the voltage output from the battery. In this figure, the horizontal axis represents the remaining charge, while the vertical axis represents the voltage output from the battery.

As shown in FIG. 9, when the remaining charge is between the end stage of the discharging (the remaining charge is below 20%) and the end stage of the charging (the remaining charge is 80%), as the remaining charge decreases, the output voltage varies at a relatively small amount of the rate of change, which is indicated by the curve denoted by reference character R1. Because the hybrid vehicle repeats the charging and discharging of the battery, the actual voltage varies as shown in the line denoted by reference character R2. The small amount of the rate of change means that, because the rate of change slightly varies, its average is small.

When the remaining charge enters the end stage of the charging (the remaining charge becomes above 80%), the rate of change in the output voltage increases. When entering the end stage of discharging (the remaining charge falls below 20%), the rate of change similarly increases. Thus, the voltage output from the battery varies depending on the remaining charge, and especially varies significantly during the end stages of the charging and discharging.

In general, the conventional electric current detector necessarily incurs an error. When the electric current is momentarily measured, the error may be permissible. However, in the time-integration of the electric current, the errors are also integrated so that the discrepancy increases as time passes. This discrepancy is not permissible in the time integration because it reduces the detection accuracy.

In the above-mentioned technique which improves the accuracy in the detection of the remaining charge, the map for correcting the battery's remaining charge is obtained based on the measurement in a steady state. Therefore, in the transient state (in which the charging and discharging of the battery are repeated so that the electric current varies), the measured values differs from those in the steady state, and the accuracy in the detection of the remaining charge is reduced due to the delay in response from the battery. That is, even when the electric current output from the battery and the regenerative electric current vary, the voltage from the battery cannot immediately become stable (cannot be immediately the value in the steady state), and attaining a stable value is delayed by a predetermined time. Thus, when detecting the remaining charge based on the voltage and electric current values measured momentarily, an error occurs in the detection.

In particular, the batteries used in the electric vehicle and the hybrid vehicle differ from those in electronic devices in that the charging and discharging of the battery are frequently repeated, thereby reducing the accuracy of the detection of the remaining charge.

BRIEF SUMMARY OF THE INVENTION

It is therefore an object of the present invention to provide an apparatus for accurately detecting the remaining charge in a battery.

In order to accomplish the above object, the apparatus for detecting remaining charge of a battery comprises: current detector (30, 40) for detecting output electric current from and regenerative electric current to the battery; voltage detector (44) for detecting a voltage output from the battery; low-pass filter (46, 50) for filtering the results of detection by the current detector and the voltage detector; time constant changer (52) for changing the time constant of the low-pass filter; integrator (54) for calculating the remaining charge in the battery by integrating the result of the detection by the current detector; threshold voltage calculator (56) for calculating a threshold voltage value corresponding to a specified value of the remaining charge, based on the electric current value filtered by the filter; comparator (58) for comparing the threshold voltage value, calculated by the threshold voltage calculator, with the voltage value filtered by the filter; and resetter (60) for setting the remaining charge to the specified value when the filtered voltage value exceeds the threshold voltage value.

In another aspect of the invention, the time constant changer decreases the time constant when the electric current is high. A plurality of the low-pass filters with different time constants output electric currents, and the time constant changer selects one of the electric currents. The integrator multiplies the detected current value by a charging efficiency which is the ratio of an electric current flowing into the battery to a charge actually stored in the battery by the electric current flowing therein.

The integrator looks up the charging efficiency in a map based on the temperature of the battery and a remaining charge. The threshold voltage calculator looks up the threshold voltage value in a map based on the temperature of the battery and a charging or discharging electric current. The threshold voltage calculator calculates an upper threshold voltage corresponding to an upper limit of the remaining charge as the specified value, and a lower threshold voltage corresponding to a lower limit of the remaining charge as the specified value. The comparator repeats the comparison of the threshold voltage value with the filtered voltage value, and the resetter sets the remaining charge to the specified value when the repetition reaches predetermined times.

Because the threshold voltage value is calculated from the filtered current value, and the voltage value, which is to be compared with the threshold voltage value, is also filtered, the remaining charge in the battery can be accurately set to a specified value, thereby eliminating any error in the integration. Therefore, even in the transient state where the battery is frequently used, the remaining charge is accurately obtained.

Further, when the electric current (drive current, or regenerative current) is high, the remaining charge is rapidly increased as the charging/discharging current increases. In the conventional technique, when the time constant of the filter is high, the charging or discharging may continue after the output from the filter becomes steady. As a result, the remaining charge may exceed 80% or fall below 20%. In this invention, because the time constant changer decreases the time constant (the filtering effect is reduced) so as to use an approximate value of the detection by the current detector when the electric current is high, the accuracy in the calculation of the threshold voltage value can be improved.

DETAILED DESCRIPTION OF THE INVENTION

The embodiment of the apparatus for detecting the remaining charge in the battery according to the present invention will be explained with reference to figures.

Figure 1:
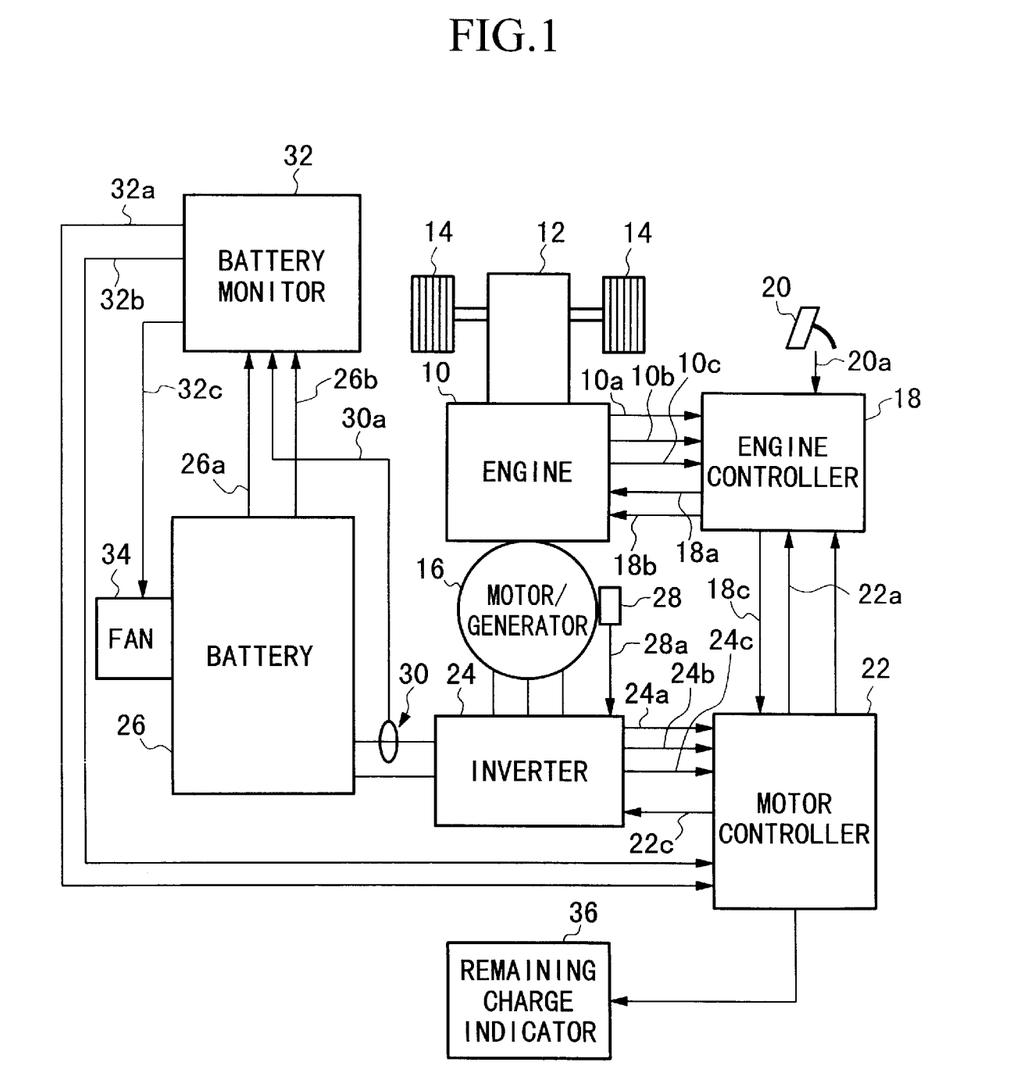
FIG. 1 is a block diagram showing the entire structure of the vehicle using the apparatus for detecting the remaining charge of the present invention.

FIG. 1 is a block diagram showing the entire structure of a vehicle using the detector for the remaining charge of the present invention. In this embodiment, the present invention is applied to the hybrid vehicle.

In FIG. 1, reference numeral 10 denotes an engine, from which a driving force is transmitted via a transmission 12 to wheels 14. A motor/generator 16 driven by a three-phase alternating current is provided in parallel with the engine 10. The rotational shaft of the motor/generator 16 is directly connected with the rotational shaft of the engine 10. When the engine 10 is stopped, the driving force from the motor/generator 16 is transmitted via the transmission 12 to the wheels 14. When the engine 10 is driven, the engine rotates the motor/generator 16, which therefore acts as a generator.

Reference numeral 18 denotes an engine controller which receives signals indicating the engine rotational speed Ne, an air intake passage pressure Pb, and water temperature Tw, via signal lines 10a, 10b, and 10c from the engine 10, and which receives a signal $\theta_{Th}$ indicating the angle of depression or inclination of an accelerator pedal 20 through a signal line 20a. Based on these signals, the engine controller 18 calculates an amount of fuel to be supplied to the engine, and ignition timing, and outputs signals for controlling the fuel amount and the ignition timing through signal lines 18a and 18b.

Further, the engine controller 18 controls the operation of the motor/generator 16. The engine controller 18 is connected to a motor controller 22 through signal lines 18c and 22a. The engine controller 18 outputs a control signal to the motor controller 22 through the signal line 18c, regulate the output power of the motor/generator 16. The motor controller 22 outputs the remaining charge in the battery 26 to the engine controller 18 through the signal line 22a. The engine controller 18 calculates the driving force or the regenerative force by the motor/generator 16, based on the remaining charge in the battery 26 and the driving condition of the engine 10 (e.g., the depression of the accelerator, or the engine rotational speed), and sends the result to the motor controller 22 through the signal line 18c.

Reference numeral 24 denotes an inverter connected to the battery 26. Based on a control signal supplied from the motor controller 22 through a signal line 22c, the inverter 24 converts the electric power from the battery 26 into a three-phase alternating current at a predetermine value, and supplies it to the motor/generator 16. The motor/generator 16 has an angle detector 28, and the detected angle is input to the inverter 24 through a signal line 28a. The angle detector 28 is attached to the rotational shaft of the motor/generator 16, to detect the rotational angle of the shaft. The detected angle is sent from the inverter 24 to the motor controller 22 through a signal line 24a.

The inverter 24 detects a phase current and all electric currents flowing through the motor/generator 16, and output the detected electric currents to the motor controller 22 through the signal lines 24b and 24c. To produce the output power by the motor regulated by the control signal sent from the engine controller 18 through the signal line 18c, the motor controller 22 calculates the electric power to be supplied to the motor/generator 16, based on the rotation angle, phase current, and all electric currents input from the inverter 24 through the signal lines 24a, 24b, and 24c, and outputs the result through the signal line 22c as a control signal.

Between the battery 26 and the inverter 24, a current detector 30 for detecting the current output from the battery 26 is provided, and the detected value is output to a battery monitor 32 through a signal line 30a.

The battery 26 comprises ten sub-batteries connected together in serial, and each sub-battery has a voltage detector and a temperature detector (not shown), from which the detected voltage and temperature are output to the battery monitor 32 through signal lines 26a and 26b.

The battery monitor 32 monitors the condition of the battery 26, e.g., the remaining charge and the temperature, outputs the remaining charge in the battery 26 through the signal line 32a, and the voltage, which is output from the battery 26, to the motor controller 22 through a signal line 32b.

Further, based on the temperature of the sub-batteries input through the signal line 26b, the battery monitor 32 controls the temperature of the battery 26 by outputting a driving control signal for controlling a fan 34 through a signal line 32c.

Reference numeral 36 denotes a remaining charge indicator for indicating the remaining charge in the battery 26, which is attached to, e.g., a display panel of a driver's seat to indicate the remaining charge to a driver.

The entire operation of the vehicle with the detector for the battery remaining charge will be explained below.

Initially, the operation is described when the vehicle is driven by the engine 10.

As a driver depresses the accelerator pedal 20, the signal $\theta_{Th}$ indicating the depressing angle of an accelerator pedal 20 is input to the engine controller 18 through the signal line 20a. On reception of the signal $\theta_{Th}$, the engine controller 18 outputs the signal, which controls the fuel supplied to the engine, through the signal line 18a to the engine 10, and simultaneously outputs the signal, which controls the ignition timing, through the signal line 18b to the engine 10.

Based on these signals, the engine 10 injects a specified amount of fuel into the cylinders, and ignites gas at a specified timing. The driving force from the engine 10 is transmitted via the transmission 12 to the wheels 14 to drive the vehicle. While driving the vehicle using the engine 10, the signals indicating the engine rotational speed, the air intake passage pressure, and the water temperature are output from the engine 10 through the signal lines 10a, 10b, and 10c to the engine controller 18. Based on these signals and on the signal $\theta_{Th}$ indicating the depression angle of the accelerator pedal 20, the engine controller 18 outputs the control signal for the engine 10 through the signal lines 18a and 18b.

As described above, because the rotational shaft of the engine 10 is directly connected to the rotational shaft of the motor/generator 16, the motor/generator 16 generates electric energy by the rotation of the engine 10. The electric energy from the motor/generator 16 is supplied via the inverter 24 to the battery 26, thereby charging the battery 26.

While the battery 26 is being charged, the current detector 30 detects the current flowing from the inverter 24 to the battery 26, and outputs the detected current value through the signal line 30a to the battery monitor 32.

Next, the operation will be explained when the motor/generator 16 drives the vehicle.

As the driver depresses the accelerator pedal 20, the signal $\theta_{Th}$ indicating the depressing angle of an accelerator pedal 20 is input to engine controller 18 through the signal line 20a. On reception of the signal $\theta_{Th}$, the engine controller 18 outputs the control signal, corresponding to the signal $\theta_{Th}$ indicating the angle of depression or inclination of the accelerator pedal 20, through the signal line 18c, when the remaining charge in the battery 26 input through the signal line 22a is equal to or above a predetermined value.

Based on the control signal input through the signal line 18c, the motor controller 22 outputs the control signal to the inverter 24 through the signal line 22c. On reception of the control signal, the inverter 24 converts the current, supplied from the battery 26, into the three-phase alternating current corresponding to the input control signal, and supplies it to the motor/generator 16. Thus, the motor/generator 16 is rotated, and this driving force is transmitted via the transmission 12 to the wheel 14 to start the vehicle.

After the start of the rotation of the motor/generator 16, the angle detector 28 outputs the detected angle to the inverter 24, which then outputs the detected angle, phase current, and all currents to the motor controller 22. To produce the output power by the motor regulated by the control signal sent from the engine controller 18 through the signal line 18c, the motor controller 22 calculates the electric power to be supplied to the motor/generator 16, based on the signals from the inverter 24, and outputs the result through the signal line 22c as the control signal. The inverter 24 converts the electric power, supplied from the battery 26, into the three-phase alternating current at a value corresponding to the control signal, and supplies it to the motor/generator 16.

When the vehicle is driven by the engine 10 or the motor/generator 16, the current detected by the current detector 30 and the voltage and temperature output from the battery 26 are input to the battery monitor 32. Based on these detected values, the battery monitor 32 adjusts the temperature of the battery 26 by controlling the fan 34, calculates the remaining charge in the battery 26, and outputs the calculated remaining charge to the motor controller 22 through the signal line 32a. The remaining charge, output to the motor controller 22, is output also to the engine controller 18 and to the remaining charge indicator 36.

When the remaining charge in the battery 26 is low, the engine controller 18 forcibly switches the vehicle to the drive mode using the engine 10. Based on the indication by the remaining charge indicator 36, the driver may switch the vehicle to the drive mode using only the engine 10.

The detector for remaining charge in the battery (hereinafter referred to as the battery remaining charge detector) of the present invention will be explained in detail.

Figure 2:
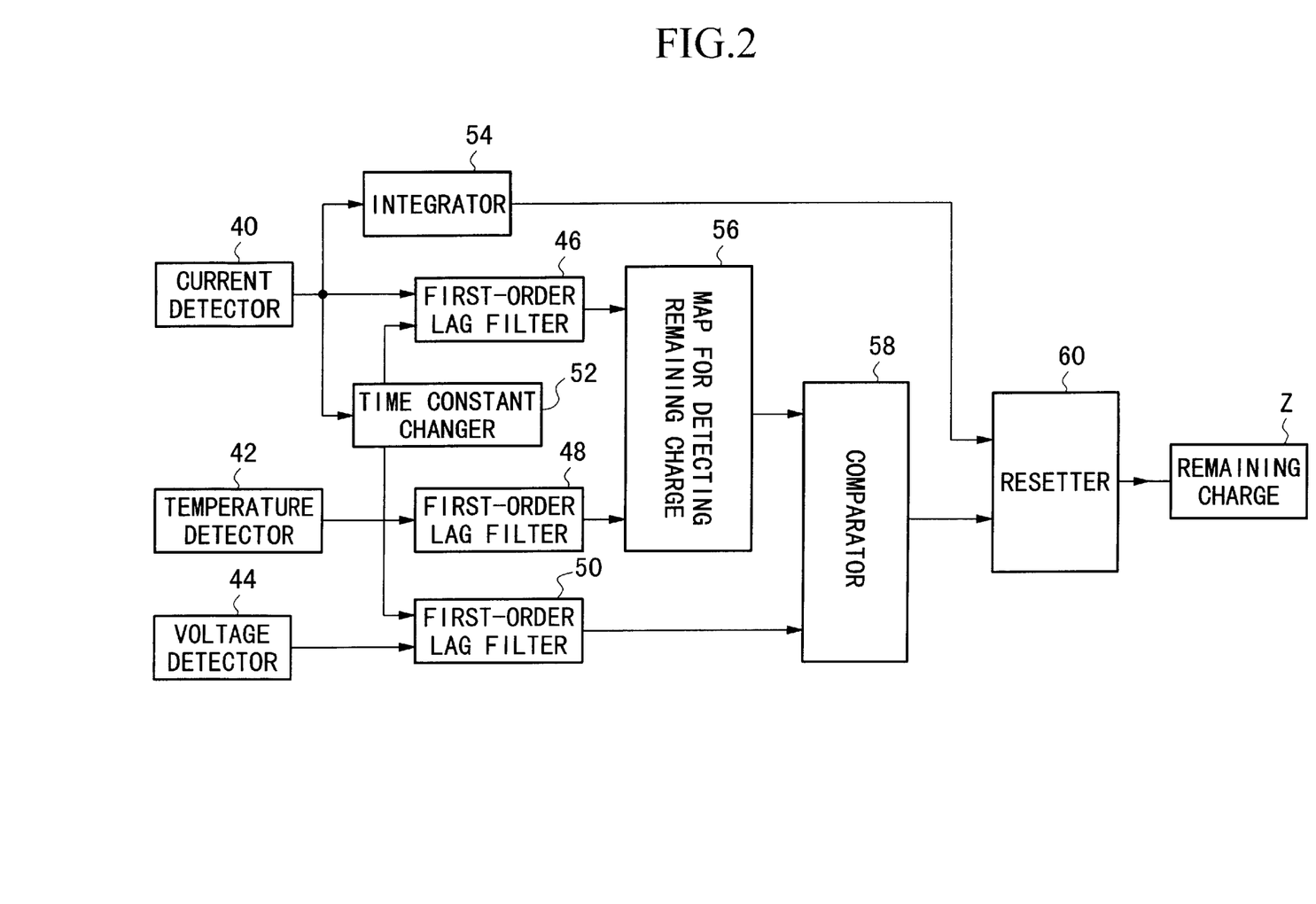
FIG. 2 is a block diagram showing the structure of the apparatus for detecting the remaining charge of the present invention.

FIG. 2 is a block diagram showing the battery remaining charge detector.

The battery remaining charge detector shown in FIG. 2 is provided in the battery monitor 32 in FIG. 1. The embodiment of the battery remaining charge detector is achieved by a general computer with a CPU (Central Processing Unit), a RAM (Random Access Memory), and a ROM (Read Only Memory), which are not shown. The following process is provided by a CPU that reads and performs programs from the ROM.

In FIG. 2, reference numeral 40 denotes a current detector corresponding to the current detector 30 in FIG. 1. Reference numeral 42 denotes a temperature detector, and 44 denotes a voltage detector, which correspond to the temperature detectors and the voltage detectors in the sub-batteries described above. The results of the detection by the current detector 40, the temperature detector 42, and the voltage detector 44 are input to first-order lag filters 46, 48, and 50. The first-order lag filters 46, 48, and 50 are the so-called low-pass filters. The signals, which are input to the first-order lag filters 46, 48, and 50, are digitized by sampling and quantizing the values detected by the current detector 40, the temperature detector 42, and the voltage detector 44. The first-order lag filter 48 for the temperature detector 42 eliminates noise (electric noise) from the detected value, and has no influence on the response characteristics of the battery 26. Therefore, the first-order lag filter 48 may be omitted.

The most simple structure for the low-pass filter using an electric circuit is comprised of a condenser and a resistor, while in this embodiment the first-order lag filters 46, 48, and 50 are provided by software. That is, when the preceding output from the first-order lag filter 46, 48, or 50 is Dn−1, and the present output is Dn, and the present detected value is D, the functions of the first-order lag filters 46, 48, and 50 are expressed by the following equation:

$$Dn = \tau_1 D_{n-1} + \tau_2 D,$$

where, $\tau_1$ and $\tau_2$ are variables for determining a time constant of the first-order lag filter 46, 48, or 50. The relationship between the variables is expressed by $\tau_1 + \tau_2 = 1$. From the characteristics of the first-order lag filters 46, 48, and 50, as the variable $\tau_2$ is increased, the effect on the present output Dn given by the present detected value D is increased. In contrast, as the variable $\tau_2$ is decreased, the effect on the present output Dn given by the present detected value D is decreased.

Accordingly, as the variable $\tau_2$ is increased, the variable of the first-order lag filter 46, 48, or 50 is decreased, while, as the variable $\tau_2$ is decreased, the variable of the first-order lag filter 46, 48, or 50 is increased. In other words, as the variable $\tau_1$ is increased, the variable of the first-order lag filter 46, 48, or 50 is increased, while, as the variable $\tau_1$ is decreased, the variable of the first-order lag filter 46, 48, or 50 is decreased.

Examples of the variables $\tau_1$ and $\tau_2$ are shown in the following equation:

$$Dn = 0.95 D_{n-1} + 0.05 D$$

Returning to FIG. 2, reference numeral 52 denotes a time constant changer, which varies the time constants of the first-order lag filters 46 and 50, depending on the output from the current detector 40.

Reference numeral 54 denotes an integrator, which integrates the result of the detection by the current detector 40, integrates the current output from the battery 26 in FIG. 1 and the regenerative current from the battery 26, to thereby calculate the remaining charge in the battery 26. The charging of the battery 26 is not always proportional to the current flowing into the battery 26, that is, the charging efficiency changes depending on the temperature and the remaining charge in the battery 26. Therefore, a map indicating the relationship between the temperature, the remaining charge in the battery 26, and the charging efficiency is prepared beforehand. The charging efficiency η is obtained from the temperature and the remaining charge in the battery 26. Based on the charging efficiency η and the current flowing into the battery 26, the remaining charge in the battery 26 is calculated.

Reference numeral 56 denotes a map for detecting the remaining charge (threshold voltage calculator). According to the map which indicates the relationship between the battery temperature, the battery output, and the battery output voltage, when the remaining charge of the sub-batteries of the battery 26 reaches a predetermined value (e.g., 80% or 20%), a voltage (upper limit voltage, threshold voltage) corresponding to the remaining charge of 80% and a voltage (lower limit voltage, threshold voltage) corresponding to the remaining charge of 20% are obtained from the electric current value output from the first-order lag filter 46 and from the temperature output from the first-order lag filter 48.

The map 56 for detecting the remaining charge will be explained in more detail.

Figure 3A:
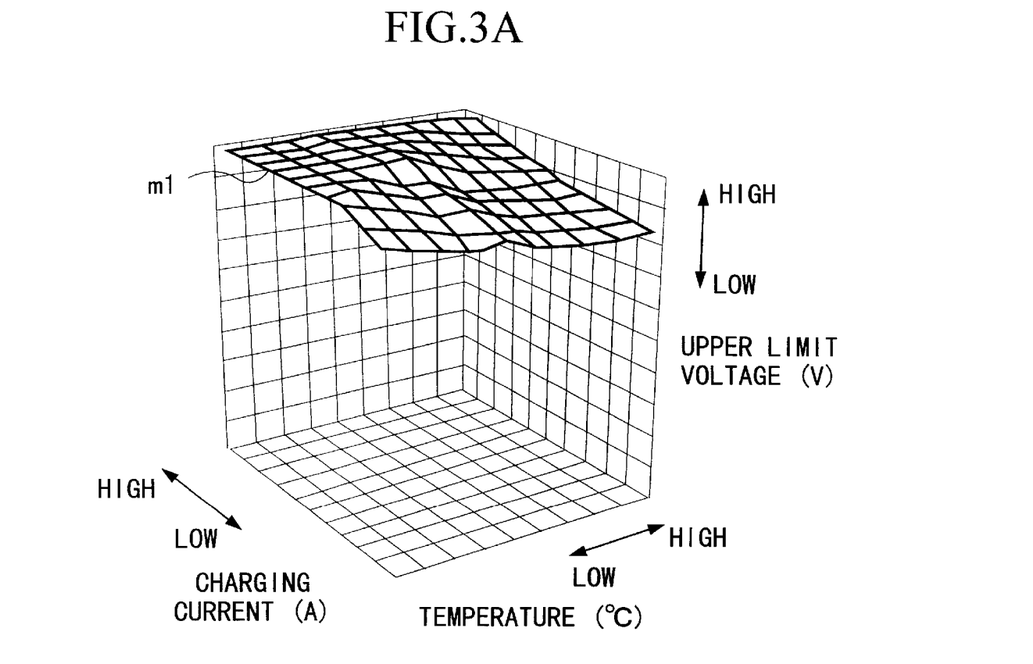
FIGS. 3A and 3B show maps of the present invention for correcting the remaining charge in the battery at the beginning of the end stage of the charging (when the remaining charge is 80%) and at the beginning of the end stage of discharging (when the remaining charge is 20%), based on the temperature of the battery, the electric current output from the battery, and the voltage output from the battery.
Figure 3B:
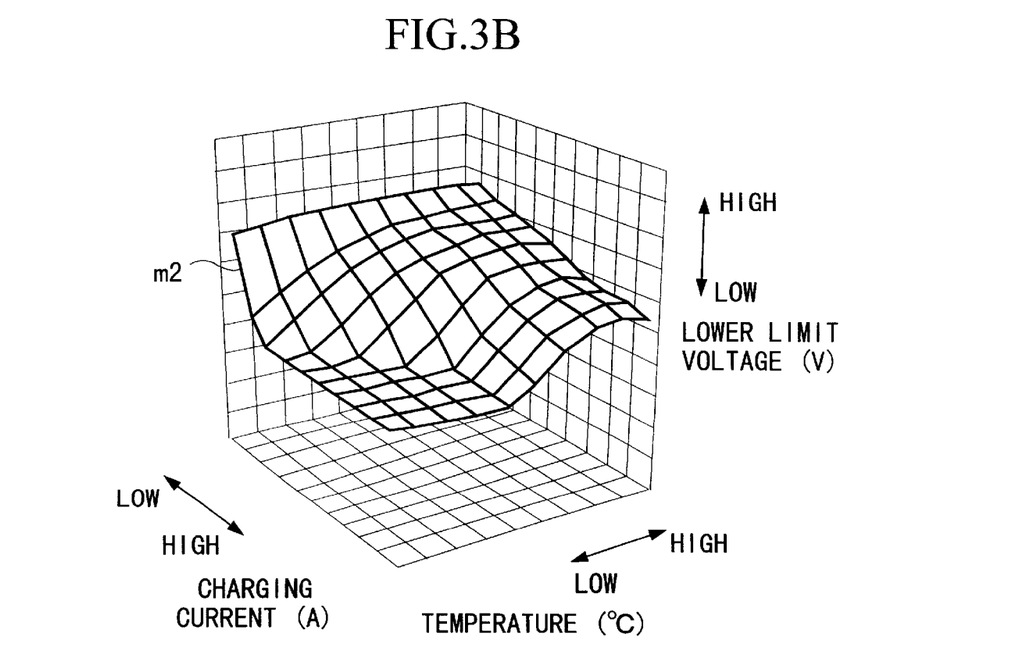

FIGS. 3A and 3B are diagrams showing maps for calculating the starting points of the end stage of charging (when the remaining charge is 80%) and of the end stage of discharging (when the remaining charge is 20%). These maps define the relationship between the battery temperature, the battery output electric current, and the battery output voltage. FIG. 3A shows the map for correcting the battery remaining charge, which defines the relationship between the battery temperature, the battery output voltage, and the battery output electric current when the remaining charge is 80%. FIG. 3B shows the map when the remaining charge is 20%.

In FIG. 3A, the surface indicated by reference character m1 corresponds to the map for correcting the battery remaining charge when the remaining charge is 80%, while the surface indicated by reference character m2 corresponds to the map for correcting the battery remaining charge when the remaining charge is 20%. If the battery remaining charge does not depend on the changes in the electric current and the temperature, the correction maps m1 and m2 are assumed to be flat. As shown in FIGS. 3A and 3B, because the correction maps m1 and m2 are not flat, the battery remaining charge clearly depends on the battery temperature, the output electric current, and the output voltage.

To measure the remaining charge based on the battery output voltage, the battery temperature, and the battery output electric current are initially measured. Then, from the measured temperature and output voltage, the actual output voltage corresponding to the remaining charge of 80% or 20%, is calculated. The output voltage (upper limit voltage) corresponding to the remaining charge of 80% is obtained from the correction map m1 in FIG. 3A, and the output voltage (lower limit voltage) corresponding to the remaining charge of 20% is obtained from the correction map m2 in FIG. 3B. The measured voltage output from the battery is compared with the upper or lower limit voltage. When the battery output voltage is above the upper limit voltage, it is judged that the battery is in the end stage of charging, while, when below the lower limit voltage, it is judged that the battery is in the end stage of discharging.

The battery 26, shown in FIG. 1, comprises ten sub-batteries, and each sub-battery has the voltage detector. In this embodiment, when at least one of the outputs from the sub-batteries is above the upper limit voltage, it is judged that the battery remaining charge is 80%. When at least one of the outputs from the sub-batteries is below the lower limit voltage, it is judged that the battery remaining charge is 20%.

A comparator 58 compares the voltage, output from the first-order lag filter 50, with the upper or lower limit voltage obtained from the map 56 for detecting the remaining charge, and determines whether the output voltage is above the upper limit voltage or below the lower limit voltage. The comparator 58 outputs the result when the output voltage is above the upper limit voltage or below the lower limit voltage.

A resetter 60 rests the value from the integrator 54, depending on the output from the comparator 58.

That is, the resetter 60 resets the value output from the integrator 54 when the comparator 58 outputs the signal indicating that the present voltage is equal to the voltage corresponding to the remaining charge of 80%, so as to set the present remaining charge Z of the battery 26 to 80%. Similarly, the resetter 60 resets the value output from the integrator 54 when the comparator 58 outputs the signal indicating that the present voltage is equal to the voltage corresponding to the remaining charge of 20%, so as to set the present remaining charge Z of the battery 26 to 20%. When the comparator 58 outputs the signal indicating that the present voltage is between the voltages corresponding to the remaining charge of 80% and 20%, the value output from the integrator 54 is set as the remaining charge Z.

The operation of the battery remaining charge detector of the present invention will be explained with reference to FIGS. 4 to 8.

Figure 4:
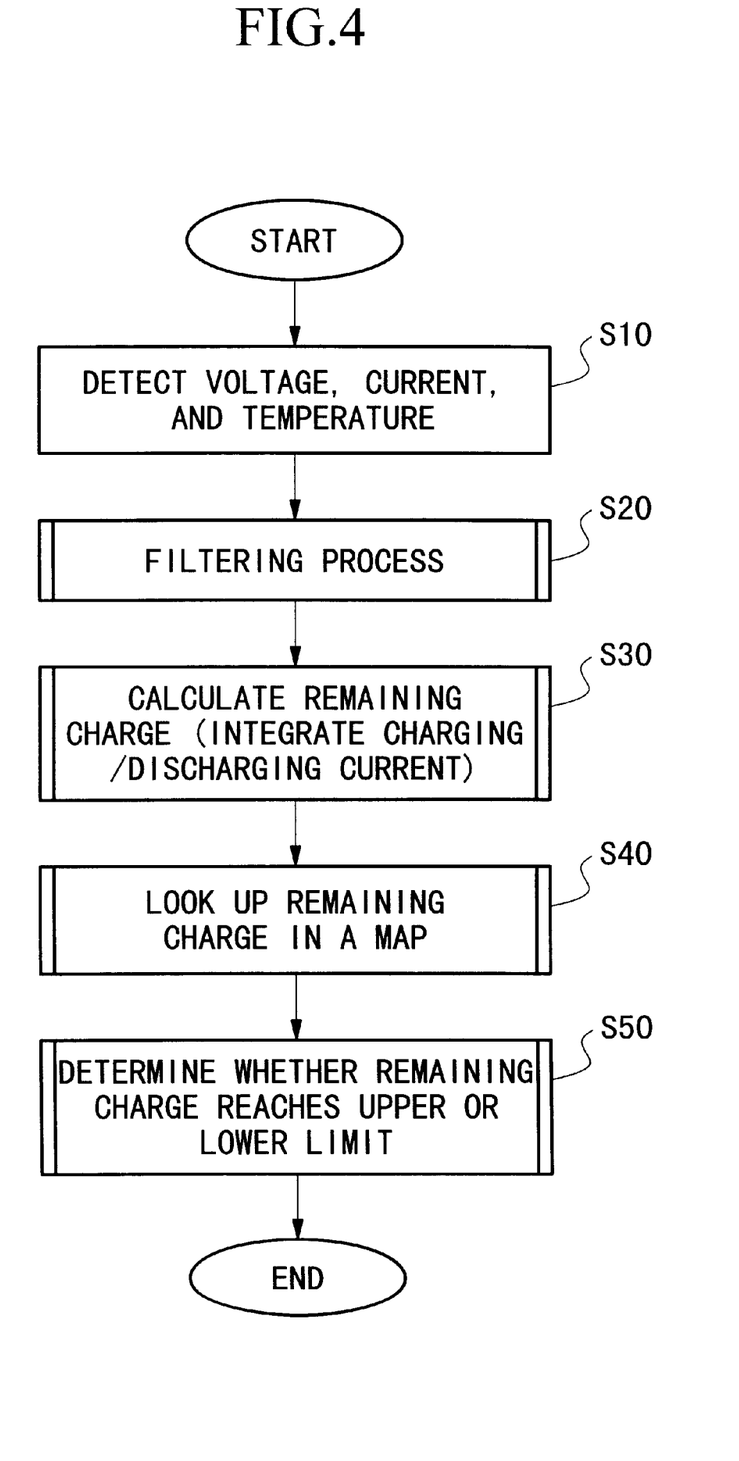
FIG. 4 is a flowchart showing the main routine in the operation of the apparatus for detecting the remaining charge of the present invention.

FIG. 4 is a flowchart showing the main routine in the operation of the battery remaining charge detector.

Steps in the flowchart are performed at a predetermined interval. The interval between steps will be mentioned below.

When the driver starts the vehicle shown in FIG. 1, the battery remaining charge detector also starts processing.

After the start of the battery remaining charge detector, the current detector 40 detects the electric current which flows between the battery 26 and the inverter 24, the temperature detector 42 detects the temperature of the sub-battery of the battery 26, and the voltage detector 44 detects the voltage output from the sub-battery (step S10). This step is repeated at an interval of 10 msec. Therefore, the detected values are sampled at the interval of 10 msec. Because this embodiment includes ten sub-batteries, there are ten pairs of signals of the voltages from the sub-batteries and of the temperatures of the sub-batteries.

The electric current value detected by the current detector 40 is input to the integrator 54, the time constant changer 52, and the first-order lag filter 46. The integrator 54 integrates the input electric current. Since the integrated electric current provided by the integrator 54 corresponds to the total electric charge which is charged to and discharged from the battery 26, the remaining charge is obtained from the integrated value.

The electric current detected by the current detector 40 is input to the first-order lag filter 46, and is simultaneously input to the time constant changer 52, where the filter process is performed. Similarly, the first-order lag filters 48 and 50 perform the filter processes (step S20). These processes are repeated at an interval of 10 msec.

The filter process in step S20 will now be explained.

Figure 5:
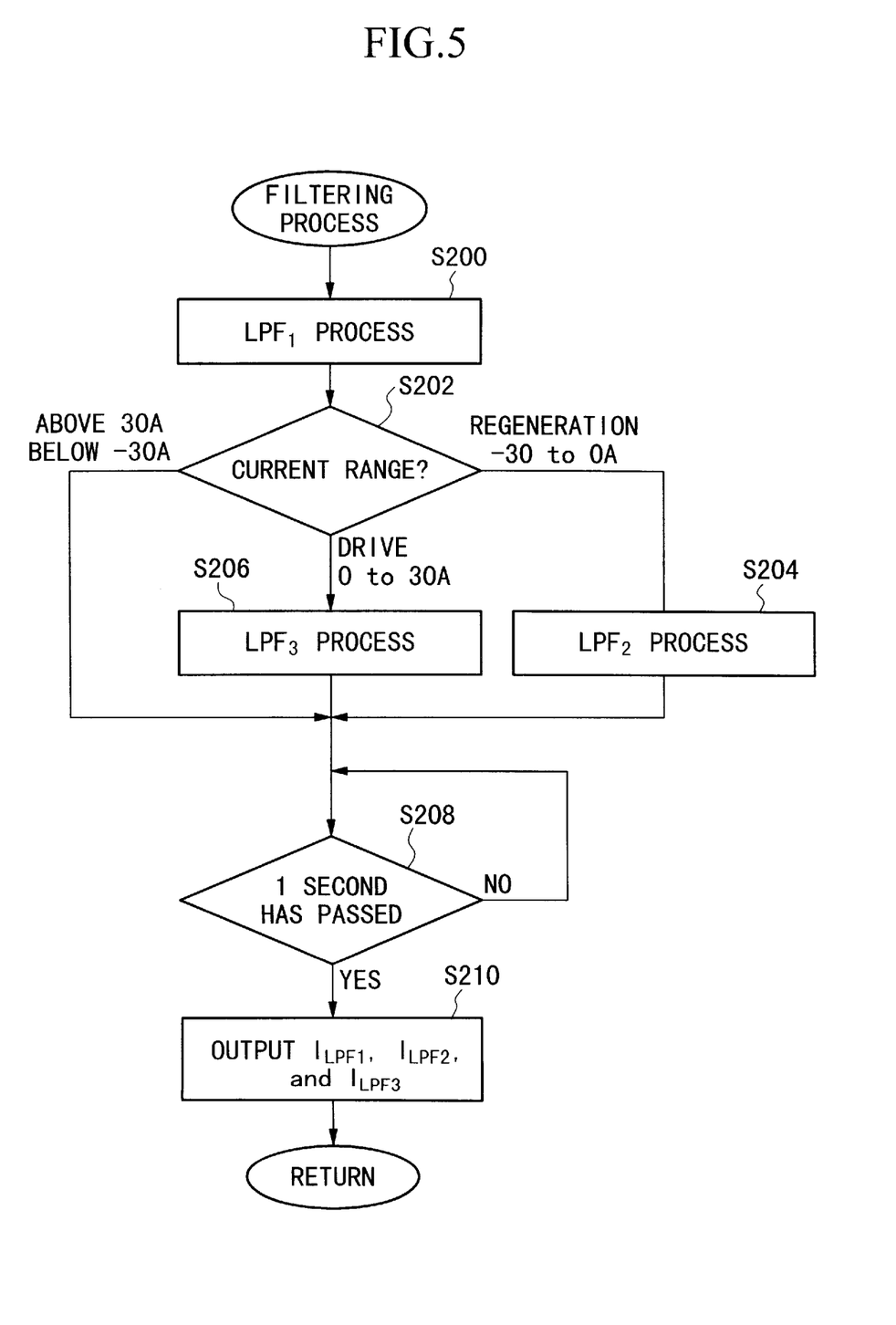
FIG. 5 is a flowchart showing a filtering process of the present invention.

FIG. 5 is a flowchart showing the procedure of the filter process. FIG. 5 shows the filter process performed in the first-order lag filter 42. Similar processes are performed by the other first-order lag filters 48 and 50.

Once the filter process has commenced, the filter process is performed using a first filter $LPF_1$ (time constant: 1 sec.) (step S200). The electric current value obtained by the first filter LPF1 is indicated by $I_{LPF1}$. Then, the electric current value (electric current range) is measured (step S202). This process is required to properly set the time constant depending on the detected electric current value. When in step S202 the detected electric current value is in the range of −30 to 0 A, the flow proceeds to step S204. In step S204, the filter process using a second filter (time constant: 20 sec.). The electric current value obtained by the filter process using the second filter $LPF_2$ is indicated by $I_{LPF2}$. As described above, the time constant for the first filter $LPF_1$ is 1 sec., and the time constant for the second and third filters $LPF_2$ and $LPF_3$ is 20 sec.

When in step S202 the electric current value is within the range of 0 to 30 A, the filter process using the third filter $LPF_3$ (time constant: 20 sec.) is performed (step S206). The electric current value obtained by the third filter $LPF_3$ is indicated by $I_{LPF3}$.

The second filter $LPF_2$ is used when charging the battery 26, and has the time constant for relatively low electric current value, while the third filter $LPF_3$ is used when the battery 26 discharges energy, and has the time constant for the relatively low electric current value.

While in the embodiment the time constants of the second and third filter $LPF_2$ and $LPF_3$ are the same, the time constants may be different.

When in steps S204, S206, and S202, the electric current is below −30 A or above 30 A, the flow proceeds to step S208.

In the above process, the filtered electric current is obtained. When the electric current value is within the range of −30 to 30 A, the electric current values $I_{LPF1}$ and $I_{LPF2}$, or $I_{LPF1}$ and $I_{LPF3}$ are obtained. Although it seems from FIG. 2 that the time constant changer 52 varies the time constants of the first-order lag filter 46 depending on the electric current value output from the current detector 40, this embodiment performs the filter process with the first filter $LPF_1$ and either the second filter $LPF_2$ or the third filter $LPF_3$, which have different time constants, and then selects one of the electric current values $I_{LPF1}$, $I_{LPF2}$, and $I_{LPF3}$ based on the electric current value, in order to accelerate the process and simplify the structure.

In addition, when the electric current is below −30 A or above 30 A, the electric current values $I_{LPF2}$ and $I_{LPF3}$ are not provided.

Returning to FIG. 5, it is determined in step S208 whether 1 sec. has passed after the filter process was started. Because the step S30 and the following steps in FIG. 4 are repeated at an interval of 1 sec., step S208 adjusts the timing. When in step S208 the judgement is "NO", step S208 is repeated. When in step S208 the judgement is "YES", the flow proceeds to step S210.

In step S210, the electric current values $I_{LPF1}$, $I_{LPF2}$, and $I_{LPF3}$, which were obtained in steps S200, S204, and S206, are output to registers (not shown). When one of or both the electric current values $I_{LPF1}$, and $I_{LPF3}$ or the current values $I_{LPF2}$, and $I_{LPF3}$ are not obtained, "0" is output as the value. Thus, the filter process is completed.

Figure 6:
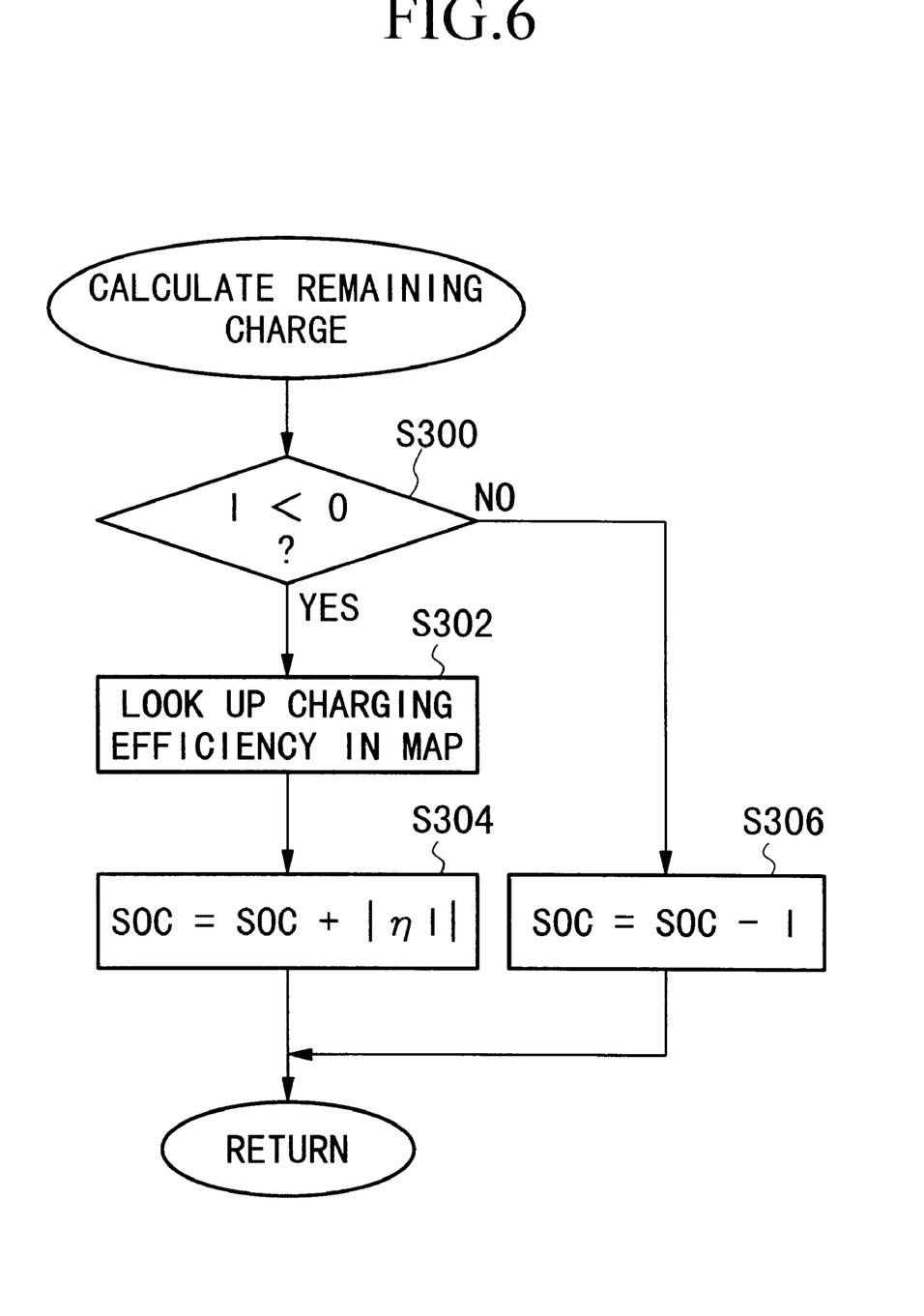
FIG. 6 is a flowchart showing the calculation of the remaining charge according to the present invention.

The process (step S30) for calculating the remaining charge, which is shown in FIG. 4, will be explained. FIG. 6 is a flowchart showing the procedure for calculating the remaining charge. This process is performed by the integrator 54 shown in FIG. 2. The process of step S30 is repeated at an interval of 1 sec.

When the calculation of the remaining charge is started, it is determined whether the input electric current value is negative or not (step S300). When the electric current is negative, the current flows into the battery 26. When the determination is "YES", the charging efficiency is looked up in the map (step S302). By this process, the remaining charge is accurately calculated, because while the charging of the battery is not always proportional to the electric current flowing into the battery 26, the charging efficiency depends on the battery temperature and the battery remaining charge.

Specifically, the present charging efficiency η is looked up in the charging efficiency map, based on the temperature of the sub-battery detected by the temperature detector 42 and the present remaining charge in the battery 26. The charging efficiency η should be based on the values output from the first-order lag filter 48, because it becomes more accurate than an efficiency based on the values directly output from the temperature detector 42. Since the battery 26 comprises ten sub-batteries, the charging efficiency η is calculated for each sub-battery.

When the process for calculating the charging efficiency η is completed, the electric current value output from the current detector 40 is multiplied by the obtained charging efficiency η, and the absolute value of the result is added to the present remaining charge (SOC: state of charge), to thereby obtain a new battery remaining charge. This process is performed for each of ten sub-batteries.

When in step S306 the determination is "NO", that is, when the electric current value detected by the current detector 40 is positive, the flow proceeds to step S306. When the electric current value is positive, the electric current is output from the battery 26.

In step S306, the electric current value, which was detected by the current detector 40, is subtracted from the present remaining charge to obtain a new remaining charge. This step is performed for each of ten sub-batteries.

When step S304 or S306 is completed, the flow returns to the main routine shown in FIG. 4.

When the process for calculating the remaining charge in step S40 is completed, the process for looking up the limit voltage for the remaining charge in the map is performed (step S40). This look-up is repeated at an interval of 1 sec.

Figure 7:
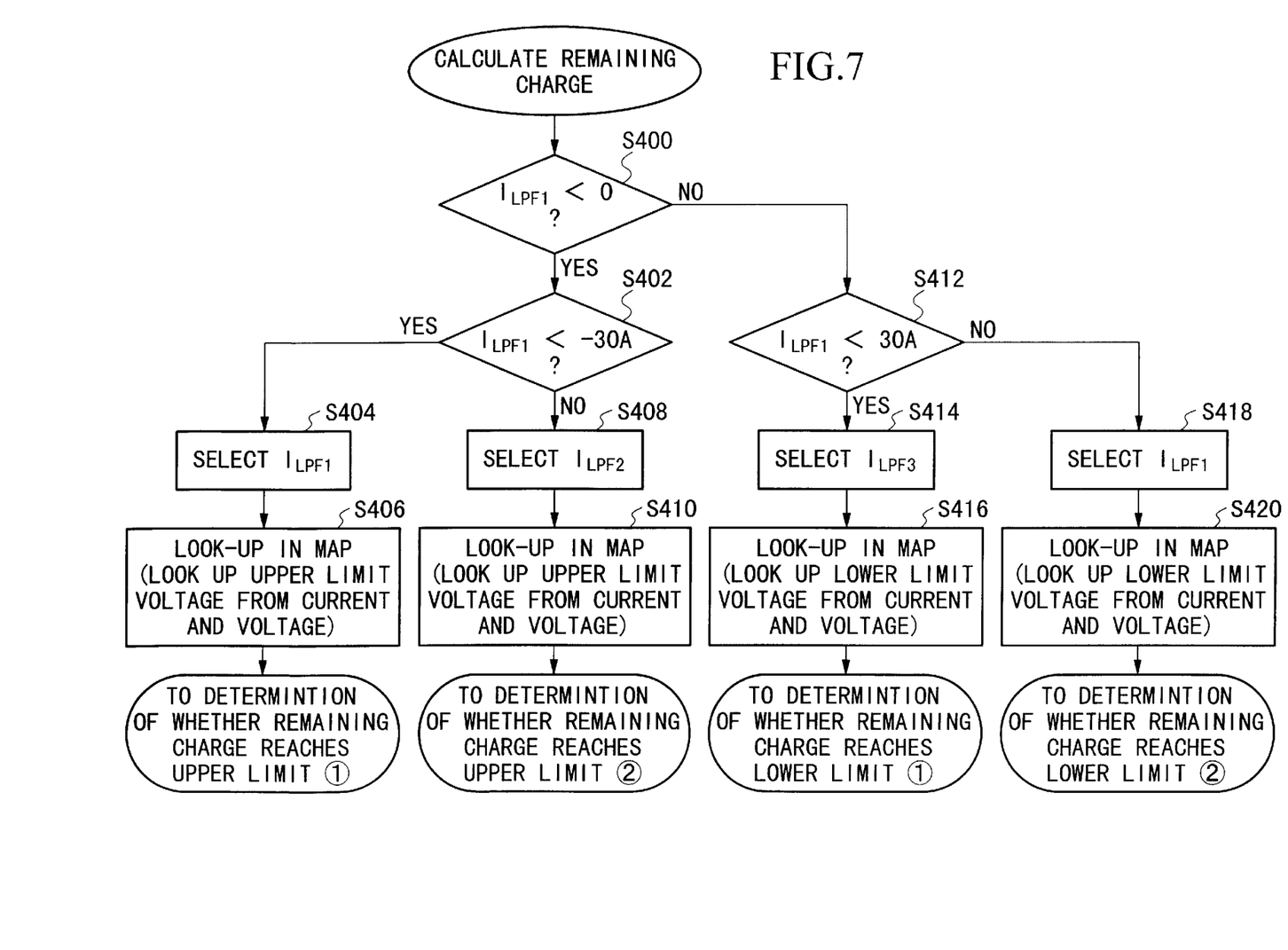
FIG. 7 is a flowchart showing the look-up of the limit voltage in the map according to the present invention.

FIG. 7 is a flowchart showing the process for looking up the limit voltage in the map. This process is performed with the map 56 for detecting the remaining charge in FIG. 2.

Once the look-up is started, it is determined whether the electric current value $I_{LPF1}$, which was output in step S210 in FIG. 5 and is stored in the register, is negative or not (step S400). That is, it is determined whether the electric current flows into the battery 26 or not. When the determination is "YES", the flow proceeds to step S402.

In step S402, it is determined whether the electric current value $I_{LPF1}$ is below −30 A or not. When the determination is "YES", the flow proceeds to step S404, where the electric current value $I_{LPF1}$ is selected from the electric current values $I_1$, $I_{LPF2}$, and $I_{LPF3}$.

Based on the electric current value $I_{LPF1}$ and the temperature output from the first-order lag filter 48, the voltage value (upper limit voltage) corresponding to the remaining charge of 80% of the sub-battery is obtained from the map 56 (step S406). The obtained upper limit voltage value is stored in the register not shown, and the flow returns to the main routine shown in FIG. 4. The process in step S406 is performed for each of the ten sub-batteries.

When in step S402 the determination is "NO", the flow proceeds to step S408, the electric current value $I_{LPF2}$ is selected from the electric current values $I_1$, $I_{LPF2}$, and $I_{LPF3}$. That is, because the change in the electric current value is small, the electric current value, which is calculated by the low-pass filter $I_{LPF2}$ with the small time constant, is selected.

Based on the electric current value $I_{LPF2}$ and the temperature output from the first-order lag filter 48, the voltage value (upper limit voltage) corresponding to the remaining charge of 80% of the sub-battery is obtained from the map 56 (step S410). The obtained upper limit voltage value is stored in the register not shown, and the flow returns to the main routine shown in FIG. 4. The process in step S410 is performed for each of the ten sub-batteries.

When in step S400 the determination is "NO", that is, when the electric current value $I_{LPF1}$ stored in the register is positive and the battery 26 discharges the electric current, the flow proceeds to step S412.

In step S412, it is determined whether the electric current value $I_{LPF1}$ is below 30 A or not. When this determination is "YES", the flow proceeds to step S414, where the electric current value $I_{LPF3}$ is selected from the electric current values $I_1$, $I_{LPF2}$, and $I_{LPF3}$.

Then, based on the electric current value $I_{LPF3}$ and the temperature output from the first-order lag filter 48, the voltage value (lower limit voltage) corresponding to the remaining charge of 20% of the sub-battery is obtained from the map 56 (step S416). The obtained lower limit voltage value is stored in the register not shown, and the flow returns to the main routine shown in FIG. 4. The process in step S416 is performed for each of the ten sub-batteries.

When in step S412 the determination is "NO", the flow proceeds to step S418, where the electric current value $I_{LPF1}$ is selected from the electric current values $I_1$, $I_{LPF2}$, and $I_{LPF3}$.

Based on the electric current value $I_{LPF1}$ and the temperature output from the first-order lag filter 48, the voltage value (lower limit voltage) corresponding to the remaining charge of 20% of the sub-battery is obtained from the map 56 (step S420). The obtained lower limit voltage value is stored in the register not shown, and the flow returns to the main routine shown in FIG. 4. The process in step S420 is performed for each of the ten sub-batteries.

At least one of the steps S406, S410, S416, and S420 is completed, at which point the process for determining whether the remaining charge reaches the upper or lower limit (step S50). This process is repeated by the comparator 58 and the resetter 60 in FIG. 2 at an interval of 1 sec.

Figure 8:
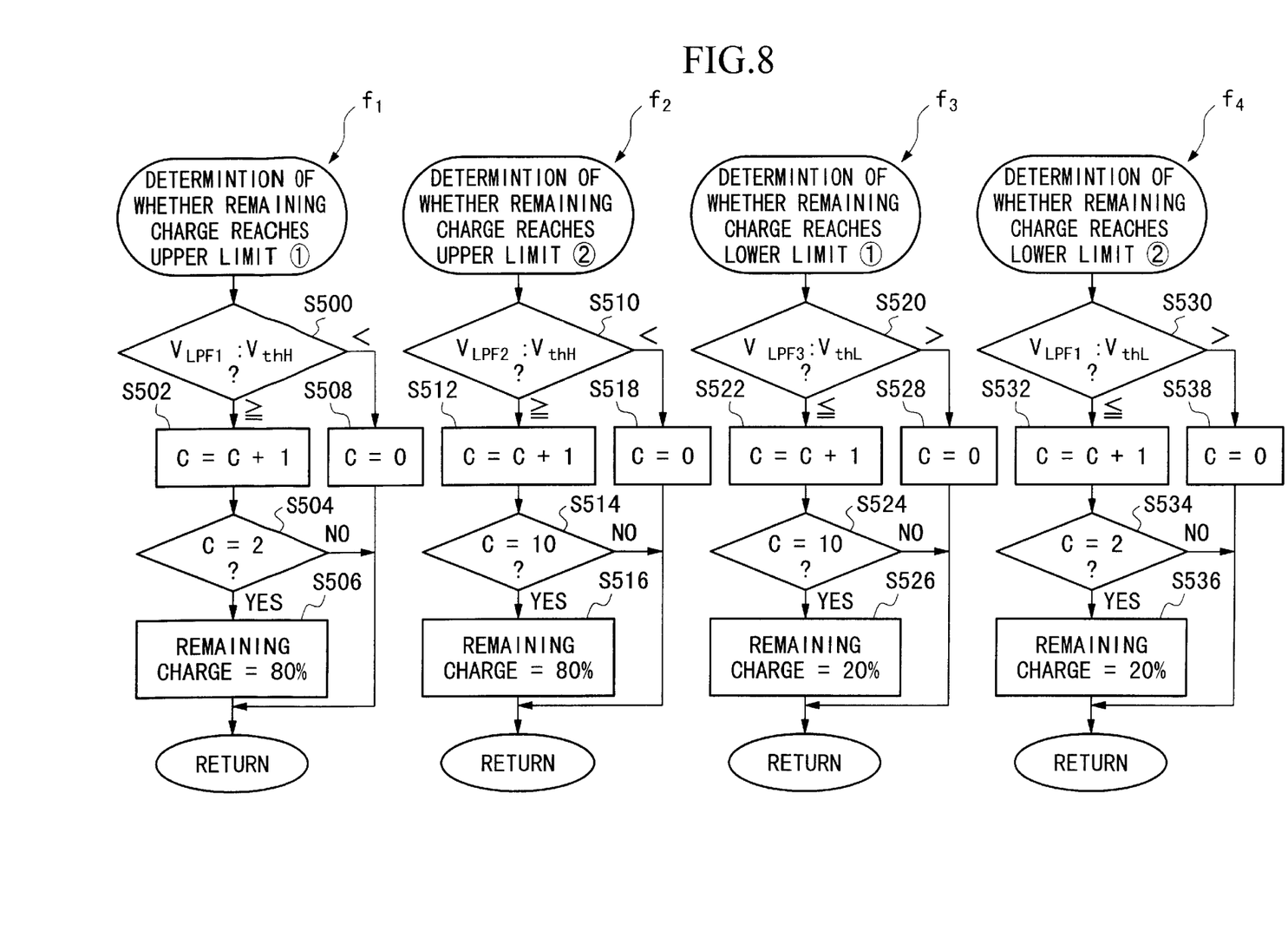
FIG. 8 is a flowchart showing the determination of whether the remaining charge reaches the upper or lower limit.

FIG. 8 is a flowchart showing the procedure for determining whether the remaining charge had reached the upper or lower limit.

While FIG. 8 shows four flowcharts, one of the flowcharts is selected depending on the result of the look-up of the limit voltage for the remaining charge in the map in FIG. 7. That is, the process of the flowchart $f_1$ in FIG. 8 follows step S406 in FIG. 7, the process of the flowchart $f_2$ in FIG. 8 follows step S410 in FIG. 7, the process of the flowchart $f_3$ in FIG. 8 follows step S416 in FIG. 7, and the process of the flowchart $f_4$ in FIG. 8 follows step S420 in FIG. 7.

Reference character "C" in FIG. 8 indicates a counter value for setting the remaining charge of sub-battery accurately to 80% or 20%. The voltage value output from the first-order lag filter 50 varies as time passes. For instance, once the remaining charge exceeds the upper voltage value $V_{thH}$, the voltage may often drop immediately. The remaining charge in the battery 26 is not immediately set to 80% the instant that the voltage value output from the first-order lag filter 50 exceeds the upper voltage value $V_{thH}$. The remaining charge in the battery 26 is then set to 80% only after the voltage value from the first-order lag filter 50 has been continuously above the upper voltage value $V_{thH}$ for a predetermined time, and thereby improving the accuracy of the detection of the remaining charge.

First, the process of the flowchart $f_1$ will be explained. Once the process is started, the voltage value $V_{LPF1}$ output from the first-order lag filter 50 is compared with the upper limit voltage value $V_{thH}$ obtained in step S406 in FIG. 7 (step S500). This process is performed for each of the voltage values output from the sub-batteries. In step S500, when the one of the voltage values $V_{LPF1}$ from the sub-batteries is above the upper limit voltage value $V_{thH}$, the flow proceeds to step S502.

In step S502, the counter value C, which is initially zero, is incremented. In step S504, it is determined whether the counter value is 2 or not. When in step S504 the determination is "YES", the flow proceeds to step S506, where the remaining charge in the battery 26 is set to 80% (the reset process is performed).

When in step S500 all of the voltage values $V_{LPF1}$ of the sub-batteries are below the upper limit voltage value $V_{thH}$, the flow proceeds to step S508, where the counter value C is set to 0.

When the process in step S506 or S508 is completed, or when in step S504 the determination is "NO", the remaining charge is equal to or below 80%. Then, the integrated value from the integrator 54 is used as the remaining charge in the battery 26, the remaining charge is not reset, and the flow returns the main routine in FIG. 4.

The process of the flowchart $f_2$ will now be explained. Once the process is started, the voltage value $V_{LPF2}$ output from the first-order lag filter 50 is compared with the upper limit voltage value $V_{thH}$ obtained in step S410 in FIG. 7 (step S510). Here, referring to FIG. 2, the time constant changer 52 varies the time constant of the first-order lag filter 50, and the voltage value is obtained by the filter process with the time constant which varies depending on the rate of change in the voltage in a manner similar to the process for the currents. This process is performed for each of the voltage values output from the sub-batteries. In step S510, when one of the voltage values $V_{LPF2}$ from the sub-batteries is above the upper limit voltage value $V_{thH}$, the flow proceeds to step S512.

In step S512, the counter value C, which is initially zero, is incremented. In step S514, it is determined whether the counter value is 10 or not. While in the flowchart $f_1$ it is determined whether the counter value C is 2 or not, it is determined in the flowchart $f_2$ whether the counter value C is 10 which is greater than 2. The reason for this is that, because the rate of change in the electric current value $I_{LPF1}$ is small in step S402 in FIG. 7, the rate of charging of the battery 26 in a unit of time is small, and it is accurately detected that the remaining charge in the battery 26 has reached 80%.

When in step S514 the determination is "YES", the flow proceeds to step S516, where the remaining charge in the battery 26 is set to 80% (the reset process is performed).

When in step S510 all of the voltage values $V_{LPF2}$ of the sub-batteries are below the upper limit voltage value $V_{thH}$, the flow proceeds to step S518, where the counter value C is set to 0.

When the process in step S516 or S518 is completed, or when in step S514 the determination is "NO", the remaining charge is equal to or below 80%. Then, the integrated value from the integrator 54 is used as the remaining charge in the battery 26, the remaining charge is not reset, and the flow returns the main routine in FIG. 4.

The process of the flowchart $f_3$ will now be explained. Once the process has started, the voltage value $V_{LPF3}$ output from the first-order lag filter 50 is compared with the lower limit voltage value $V_{thL}$ obtained in step S410 in FIG. 7 (step S520). This process is performed for each of the voltage values output from the sub-batteries. In step S520, when one of the voltage values $V_{LPF3}$ from the sub-batteries is below the lower limit voltage value $V_{thL}$, the flow proceeds to step S522.

In step S522, the counter value C, which is initially zero, is incremented. In step S524, it is determined whether the counter value is 10 or not. The reason for this is the same as that explained regarding the flowchart $f_2$.

When in step S524 the determination is "YES", the flow proceeds to step S526, where the remaining charge in the battery 26 is set to 20% (the reset process is performed).

When in step S520 all of the voltage values $V_{LPF3}$ of the sub-batteries are above the lower limit voltage value $V_{thL}$, the flow proceeds to step S528, where the counter value C is set to 0.

When the process in step S526 or S528 is completed, or when in step S524 the determination is "NO", the remaining charge is equal to or above 20%. Then, the integrated value from the integrator 54 is used as the remaining charge in the battery 26, the remaining charge is not reset, and the flow returns the main routine in FIG. 4.

The process of the flowchart $f_4$ will here be explained. Once the process is started, the voltage value $V_{LPF1}$ output from the first-order lag filter 50 is compared with the lower limit voltage value $V_{thL}$ obtained in step S410 in FIG. 7 (step S530). This process is performed for each of the voltage values output from the sub-batteries. In step S530, when one of the voltage values $V_{LPF1}$ from the sub-batteries is below the lower limit voltage value $V_{thL}$, the flow proceeds to step S532.

In step S532, the counter value C, which is initially zero, is incremented. In step S534, it is determined whether the counter value is 2 or not. The reason for the comparison of the counter value with 2 is that, because the absolute value in step S412 is high, the rate of charging of the battery 26 in a unit of time is high.

When in step S534 the determination is "YES", the flow proceeds to step S536, where the remaining charge in the battery 26 is set to 20% (the reset process is performed).

When in step S530 all of the voltage values $V_{LPF3}$ of the sub-batteries are above the lower limit voltage value $V_{thL}$, the flow proceeds to step S538, where the counter value C is set to 0.

When the process in step S536 or S538 is completed, or when in step S534 the determination is "NO", the remaining charge is equal to or above 20%. Then, the integrated value from the integrator 54 is used as the remaining charge in the battery 26, the remaining charge is not reset, and the flow returns the main routine in FIG. 4.

The process for determining whether the remaining charge reaches the upper or lower limit is completed, and the remaining charge is detected. The obtained remaining charge is output from the battery monitor 32 to the motor controller 22 through the signal line 32*a*. On reception of the remaining charge, the motor controller 22 outputs it to the engine controller 18 through the signal line 22*a* and to the remaining charge indicator 36. The remaining charge indicator 36 displays the input remaining charge as a numerical value or a graph.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. An apparatus for detecting a remaining charge in a battery, comprising:
   a current detector for detecting an output electric current from and a regenerative electric current to said battery;
   a voltage detector for detecting a voltage output from said battery;
   a low-pass filter for filtering a plurality of detected current values and a plurality of detected voltage values;
   a time constant changer for changing a time constant of said low-pass filter;
   an integrator for calculating the remaining charge of said battery by integrating the plurality of detected current values detected by said current detector;
   a remaining charge detecting map for calculating a threshold voltage value corresponding to a specified value of the remaining charge, based on a filtered electric current value filtered by said low-pass filter;
   a comparator for comparing the threshold voltage value, calculated by said remaining charge detecting map, with a filtered voltage value filtered by said low-pass filter; and
   a resetter for resetting the remaining charge to said specified value of the remaining charge when the filtered voltage value exceeds said threshold voltage value.

2. An apparatus according to claim 1, wherein said time constant changer decreases the time constant when one of the output electric current and the regenerative electric current is high.

3. An apparatus according to claim 1, further comprising a plurality of said low-pass filters with different time constants output electric currents, and the time constant changer selects one of said time constants output electric currents.

4. An apparatus according to claim 1, wherein said integrator multiplies the plurality of detected current values by a charging efficiency which is a ratio of an electric current flowing into said battery to a charge actually stored in said battery by the electric current flowing therein.

5. An apparatus according to claim 4, wherein said integrator looks up the charging efficiency in a map based on a temperature of said battery and the remaining charge.

6. An apparatus according to claim 1, wherein said remaining charge detecting map looks up the threshold voltage value in a map based on a temperature of said battery and a charging or discharging electric current.

7. An apparatus according to claim 1, wherein said remaining charge detecting map calculates an upper threshold voltage corresponding to an upper limit of the remaining charge as the specified value, and a lower threshold voltage corresponding to a lower limit of the remaining charge as the specified value.

8. An apparatus according to claim 1, wherein the comparator repeats the comparison of the threshold voltage value with the filtered voltage value, and the resetter resets the remaining charge to said specified value when the repetition reaches predetermined times.

9. A method for detecting a remaining charge of a battery, comprising the steps of:
   detecting an output electric current from and a regenerative electric current to said battery;
   detecting a voltage output from said battery;
   filtering a plurality of detected current values detected by a current detector and a plurality of detected voltage values detected by a voltage detector by a low-pass filter;
   changing a time constant of said low-pass filter;
   calculating the remaining charge of said battery by integrating the plurality of detected current values by said current detector;
   calculating a threshold voltage value corresponding to a specified value of the remaining charge, based on a filtered electric current value filtered by said low-pass filter;
   comparing the calculated threshold voltage value with a filtered voltage value filtered by said low-pass filter; and
   setting the remaining charge to said specified value when the filtered voltage value exceeds said threshold voltage value.

10. A method according to claim 9, further comprising the step of decreasing the time constant when one of the output electric current and the regenerative electric current is high.

11. A method according to claim 9, wherein said changing the time constant step includes the steps of:
    outputting electric currents from a plurality of low-pass filters with different time constants; and
    selecting one of said electric currents.

12. A method according to claim 9, wherein said calculating the remaining charge step includes the step of multiplying the plurality of detected current values by a charging efficiency with is a ratio of an electric current flowing into said battery to a charge actually stored in said battery by the electric current flowing therein.

13. A method according to claim 12, wherein said calculating the remaining charge step further includes the step of looking up the charging efficiency in a map based on a temperature of said battery and the remaining charge.

14. A method according to claim 9, wherein said calculating the threshold voltage value step includes the step of looking up the threshold voltage value in a map based on a temperature of said battery and a charging or discharging electric current.

15. A method according to claim 9, wherein said calculating the threshold voltage value step includes the step of calculating an upper threshold voltage corresponding to an upper limit of the remaining charge as the specified value, and a lower threshold voltage corresponding to a lower limit of the remaining charge as the specified value.

16. A method according to claim 9, further comprising the steps of:
    repeating the comparison of the threshold voltage value with the filtered voltage value; and
    setting the remaining charge to said specified value when the repetition reaches predetermined times.

* * * * *